United States Patent [19]

Jensen et al.

[11] Patent Number: 5,586,054

[45] Date of Patent: Dec. 17, 1996

[54] TIME-DOMAIN REFLECTOMETER FOR TESTING COAXIAL CABLES

[75] Inventors: Gordon A. Jensen; Stephen M. Ernst, both of Colorado Springs, Colo.

[73] Assignee: Fluke Corporation, Everett, Wash.

[21] Appl. No.: 272,690

[22] Filed: Jul. 8, 1994

[51] Int. Cl.$^6$ ................................. G01R 31/11
[52] U.S. Cl. ............ 364/514 B; 370/238; 359/136; 324/534; 324/512
[58] Field of Search .............. 364/514 R, 514 B; 370/85.2, 85.3; 359/136; 324/534, 512

[56] References Cited

U.S. PATENT DOCUMENTS

| | | | |
|---|---|---|---|
| 4,479,228 | 10/1984 | Crane | 375/7 |
| 4,766,386 | 8/1988 | Oliver et al. | 324/533 |
| 4,797,901 | 1/1989 | Goerne et al. | 375/10 |
| 4,809,264 | 2/1989 | Abraham et al. | 370/76 |
| 4,945,532 | 7/1990 | Hald | 370/13 |
| 5,179,341 | 1/1993 | Whiteside | 324/523 |
| 5,198,805 | 3/1993 | Whiteside et al. | 340/325.06 |
| 5,381,348 | 1/1995 | Ernst et al. | 364/514 |
| 5,390,039 | 2/1995 | Yamamoto et al. | 359/136 |

*Primary Examiner*—Emanuel T. Voeltz
*Assistant Examiner*—Patrick J. Assouad
*Attorney, Agent, or Firm*—Dellett and Walters

[57] ABSTRACT

A time-domain reflectometry device and method are provided wherein TDR may be performed on active Ethernet systems. A crossover network provides proper impedance termination both for pulse information generated by the TDR and for DC path signals. If a potential collision is detected when generating TDR pulses, a collision is forced by asserting a DC bias on the network thereby simulating a collision and generating a timeout at a much lower protocol level for reducing noticeable delay to network users and increasing network throughput.

19 Claims, 8 Drawing Sheets

TIME-DOMAIN REFLECTOMETER FOR TESTING COAXIAL CABLES

This invention relates to time-domain reflectometry and more particularly to a time-domain reflectometry apparatus and method for performing measurements on an active coaxial network.

BACKGROUND OF THE INVENTION

It is desirable to be able to perform time-domain reflectometry analysis of network cables, for example Ethernet/IEEE 802.3 coaxial cable systems, to assist in the isolation and repair of cable faults and other network problems. Such determination will typically employ a time-domain reflectometer which transmits a series of pulses into the network cabling and determines the existence and location of cabling faults based on the reflections received in response to the pulses and the amount of time between the pulse transmission and the received reflection.

The time-domain reflectometer is also useful in measuring exact cable length which may be desirable in certain network applications.

The International Standards Organization (ISO) has set forth a standard reference model of an open systems interconnection (OSI) to define the way that participating network nodes interact for exchanging information. This standard provides for seven layers of protocol, wherein the first layer is the physical communication layer wherein nodes of a network are physically interconnected in some manner. All other communications beyond the first layer are not physically connected but appear to be to the user.

In an Ethernet system, access to the network is provided via a carrier sense multiple access with collision detection (CSMA/CD) standard. In such a system, a station that wishes to transmit will first determine whether the network is currently in use (carrier sense) and if the network is not in use, the station will begin transmitting. Also the CSMA/CD system includes collision detection wherein if the station begins transmitting and soon thereafter detects a collision between its transmission and the transmission of another station, which may not have been readily apparent prior to transmitting because of propagation delays along the network, the station detecting the collision will take corrective action. In the case of an Ethernet system, this corrective action consists of sending a jam pattern which the other transmitting station, which was collided with, will recognize to indicate a collision did occur. Retransmission is then accomplished according to a "back-off algorithm" wherein each of these two or more stations involved in the collision will wait a random amount of time before retransmitting. Thus, the Ethernet system makes use of collision between station transmissions to efficiently regulate access to the network by various nodes.

When performing time-domain reflectometry on an active network, however, the pulses which are generated by the time-domain reflectometer are of such short duration as to go undetected by any of the carrier sense/collision detection systems that are designed in accordance with the international standards for Ethernet, for example ANSI/IEEE Standard 802.3. Therefore, when a collision does occur between a time-domain reflectometry pulse and data transmitted by a station on the network, the transmitting station does not detect it, and bit errors will be generated in the station's transmitted data by the time-domain reflectometry pulses. The error will likely be eventually detected at a higher layer in the protocol scheme; however, the higher in the protocol layers that error detection occurs, the longer it takes for a timeout to be completed based on the bit error that was caused by the collision with the time-domain reflectometry pulse. For example, in an Ethernet system, level 3 and level 4 timeouts are in the area of two to three seconds long. Higher level timeouts can be up to one minute long or more. Such delay is noticeable to network users and can lead to user dissatisfaction with the network.

In order to avoid problems with data corruption from time-domain reflectometry pulses, heretofore it has been necessary to bring the network down or inform all users to stop using the network and observe a network silence period while network diagnostics (particularly time-domain reflectometry) were performed. Such solutions are unsatisfactory as they tend to interfere with user confidence in the network. Also, network silence may not be observed by all users. It is desirable to perform testing and measurement on active networks since some network problems may only arise when the network is active and problems may be difficult to solve if they cannot be detected and observed by a technician as they are occurring.

SUMMARY OF THE INVENTION

According to the invention, a time-domain reflectometer is provided wherein time-domain reflectometry is performed on an operating network without causing bit errors that would go undetected by the media access control level protocol. A collision detector is provided wherein any potential collisions between the time-domain reflectometry pulse and other data frames on the network are detected and an intentional collision is then generated thereby causing retransmission at a lower level in the protocol stack. The time-domain reflectometer is connected to the network through a crossover network and pulses are sent through an AC path while the network is inactive, thus paralleling the CSMA/CD operation of an Ethernet by waiting for a clear channel before transmitting. A frame detector watches the network for an amount of time corresponding to the propagation delay of a maximum length Ethernet segment plus some margin of time and if a potential collision is observed, a collision is enforced by placing a DC bias on the crossover network to simulate a frame transmission, thereby causing the collision detect circuits in media access units of other stations or nodes on the network to detect a collision.

The subject matter of the present invention is particularly pointed out and distinctly claimed in the concluding portion of this-specification. However, both the organization and method of operation, together with further advantages and objects thereof, may best be understood by reference to the following description taken in connection with accompanying drawings wherein like reference characters refer to like elements.

DETAILED DESCRIPTION

Figure 1:
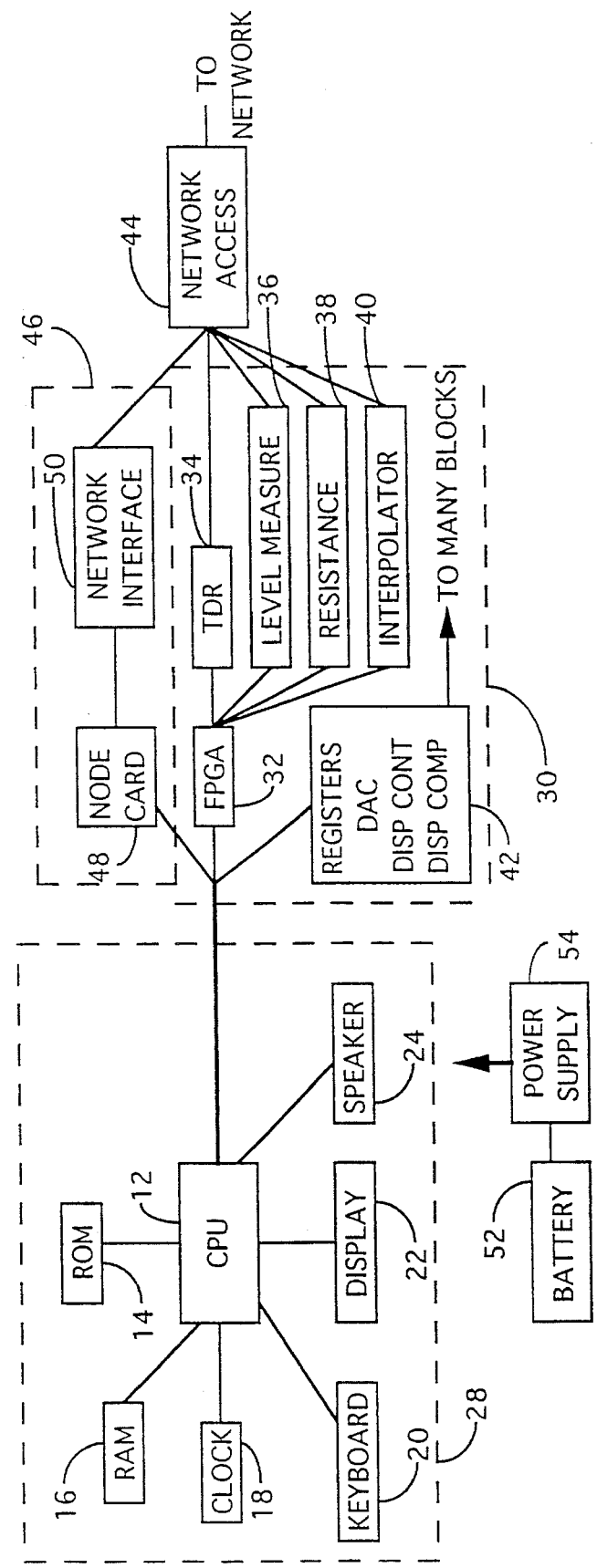
FIG. 1 is a block diagram of an instrument embodying a time-domain reflectometer according to the present invention.

Referring now to FIG. 1, a block diagram of an instrument embodying the present invention, the instrument 10, a network analysis and measurement instrument, comprises a processor 12 (CPU) which interfaces with read only memory 14 (ROM) and random access memory 16 (RAM), real time clock 18, keyboard and indicators 20, display 22 and speaker 24. Keyboard and indicators 20, display 22 and speaker 24 suitably provide a user interface to enable information to be reported to and received from a user. The display and speaker provide visible and audible information to the user, while the keyboard and indicators both receive information from the user via key strokes and provide information to the user by, for example, illuminating indicator LEDs to provide status or event indication. In a particular embodiment, the indicators may comprise separate indicators to ascertain frame errors, collisions on an Ethernet, polarity problems, and activity indicators to denote the status of the network. The indicators may further comprise a utilization status, wherein the percentage of network utilization may be displayed to convey how busy the network is.

Referring further to FIG. 1, the CPU 12, ROM 14, RAM 16, clock 18, keyboard 20, display 22 and speaker 24 together comprise the processor sub-system 28. An analog measurement sub-system 30 is also provided and comprises a field programmable gate array 32 (FPGA) which is configurable to provide a series of analog measurements, including time-domain reflectometry system 34 (TDR), level measurement 36, DC resistance measurement 38 and interpolator 40 which is used in conjunction with TDR and other measurements. The analog sub-system 30 also includes block 42 which comprises control/data registers, digital-to-analog converter (DAC), display contrast control (DISP CONT) and display temperature compensation control (DISP COMP).

The analog sub-system 30 is interconnected to the processor via the field programmable gate array 32. Block 42 is also accessible via a buffered byte bus to the processor 12.

The various analog measurement components 34, 36, 38 and 40 connect to network access block 44 which comprises an active T configuration to allow access to the network for performing tests and operations thereon. Another sub-system comprises the node card/network interface sub-system 46 wherein the node card block 48 suitably comprises circuitry that emulates a TMS380C26 network controller card. The network interface block 50 can include various interface functions for the particular networks of interest, for example, Ethernet in the specific described embodiment, or Token-Ring or other network standard interfaces. The network interface also connects through the network access 44 to the network.

The instrument is powered via battery 52/power supply 54. The battery block suitably comprises rechargeable batteries, for example nickel cadmium batteries, to enable multiple reuse cycles.

Figure 2:
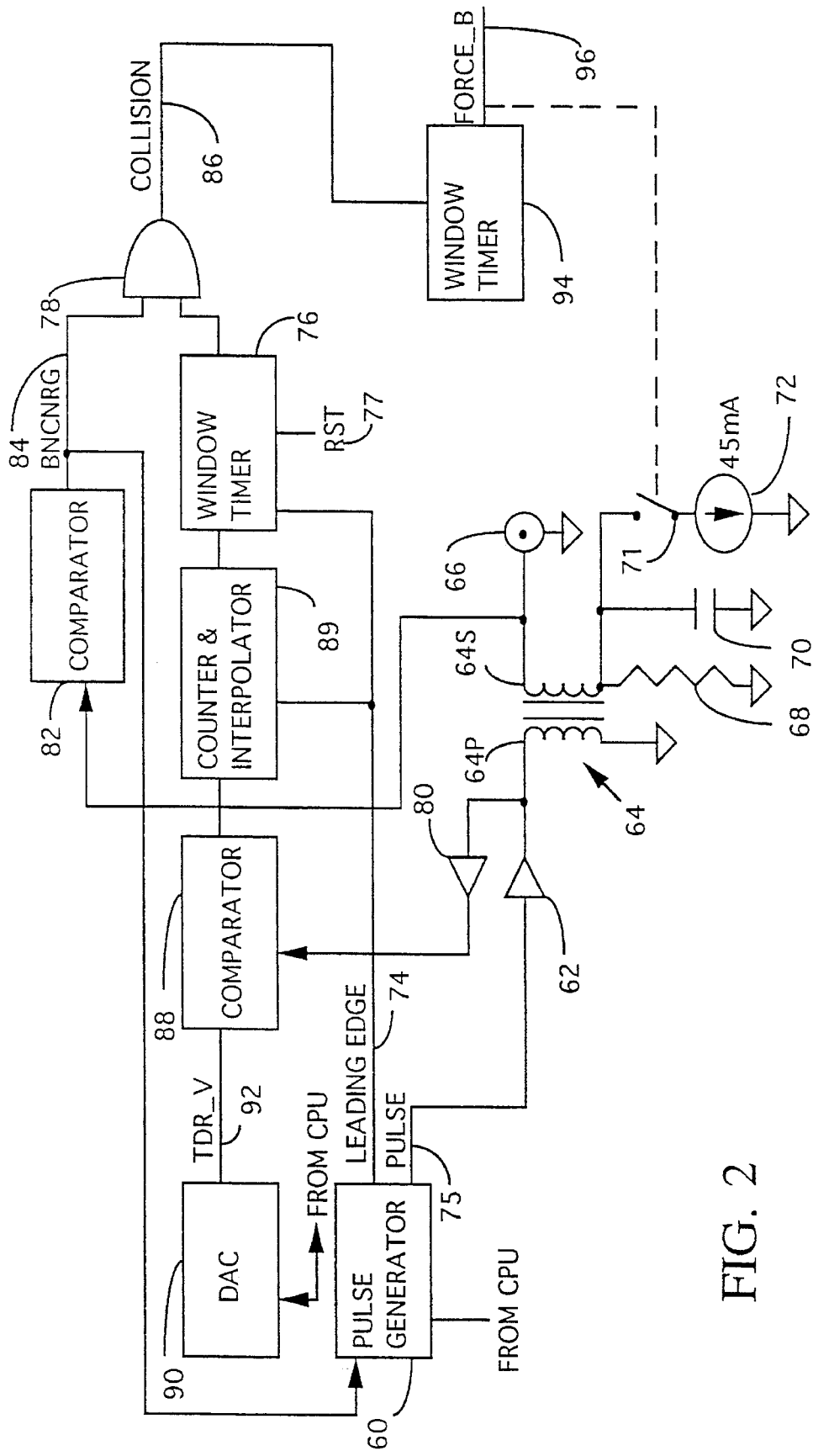
FIG. 2 is a block diagram of particular portions of the instrument of FIG. 1 when configured to operate as a time-domain reflectometer.

FIG. 2 is a block diagram of particular portions of the instrument of FIG. 1 when configured to operate as a time-domain reflectometer. Referring to FIG. 2, the time-domain reflectometer according to the present invention includes a pulse generator 60 which is coupled to a driver 62 wherein the output of the driver is supplied to a first leg of the primary 64P of transformer 64, while the second leg of the primary of the transformer is grounded. A first leg of the secondary 64S of transformer 64 is attached to the center conductor of the cable connector 66. The second leg of the secondary of transformer 64 is connected to an end of the parallel combination of resistor 68 and bypass capacitor 70 wherein the opposing ends of the resistor and capacitor are connected to ground. Resistor 68 is suitably 50 OHMS in order to provide the proper termination impedance for a DC path to the cable connector. Other impedances are suitably employable in accordance with the requirements of the particular network. Capacitor 70 provides a bypass for high frequency signals to ground.

Also supplied is a switched current source 72 which connects with switch 71 between the second leg of secondary 64S and ground, also in parallel with resistor 68 and capacitor 70. Pulse generator 60 provides a leading edge signal 74 which is received by window timer 76. The output of window timer 76 is provided to OR gate 78 as a first input thereto. A reset signal 77 (RST) is also supplied to the window timer.

A detector 80 couples with the first leg of the primary of transformer 64 and the output thereof is supplied to a comparator 88 while a second input of the comparator 88 is provided by digital-to-analog converter 90 as input signal TDR_V 92. The output of the comparator 88 is supplied to counter/interpolator block 89, which is in communication with the CPU 12 (FIG. 1) as described hereinbelow. The counter/interpolator receives the leading edge signal 74 from pulse generator 60. Portions of counter/interpolator block 89 correspond to interpolator 40 of FIG. 1.

Input from the network via connector 66 is provided to a comparator 82 wherein the comparator generates an output signal BNCNRG 84 which is supplied to the second input of AND gate 78. The AND gate generates an output signal 86 (collision). The BNCNRC signal 84 is further provided to pulse generator 60. The output signal 86 (collision) is provided as an input to window timer 94, and the output thereof comprises a FORCE_B signal 96. The FORCE_B signal is conveyed back to switch 71 for governing the operation thereof as described hereinbelow in conjunction with FIG. 2 and FIG. 3.

In operation, when time-domain reflectometry operations are to be performed, the pulse generator 60 generates a pulse supplied to driver 62 which is thereby coupled through the primary 64P of transformer 64 to the secondary 64S and to cable connector 66 to be provided along the Ethernet cable. The transformer provides an AC path for transmission and reception of pulses on the network. It should be noted that the BNCNRG signal 84, which indicates that the carrier is present on the network, supplies the pulse generator with a carrier detection input. If carrier is present, the pulse generator will wait until the carrier drops before generating the TDR pulse. Simultaneously with the generation of the pulse, the leading edge signal 74 is asserted which, when received by window timer 76, begins a timing period to indicate when to monitor for the presence of collisions. Thus, collision signal 86 will not be asserted unless window timer 76 has asserted its output to provide the window timing output. Once the pulse has been generated and coupled to the Ethernet cable, any return energy will be detected by detector 80. The returning pulse energy is received by comparator 88 and in accordance with the levels of TDR_V 92 set by digital analog converter 90, the comparator 88 will detect pulse returns of a specified magnitude. The magnitude thus specified allows positive and negative pulses to be detected of varying magnitudes which also allows multiple faults to be detected by adjustment of the level of TDR_V along with timing as discussed hereinbelow.

Once sufficient time has passed such that any pulses sent by pulse generator 60 would have returned and been detected by comparator 88 via detector 80, window timer 76 asserts its output which thus enables one leg of the AND gate 78. Once so enabled, any energy appearing at cable connector 66 will be detected by comparator 82. Upon detecting such voltage on the line, comparator 82 will generate the output signal BNCNRG 84 indicating that transmissions are occurring on the Ethernet. Thus, with the BNCNRG signal asserted in conjunction with the window timer output signal being asserted, both inputs to AND gate 78 are true as will result in the output of the AND gate 78 going high indicating a collision has potentially occurred. The window timer 76 provides several timing windows, a first window (window 0) wherein the output of the timer is low indicating that no collision detection should be taking place, followed by a second window period (window 1) which is a specific time frame wherein the output of window timer 76 is high, thus allowing any energy detected by comparator 82 to result in a collision detection that is then employed to force a collision as noted hereinbelow. The window 1 period suitably ends after an amount of time equal to the Ethernet slot time (plus a small margin) has passed following the transmission of the TDR pulse. The reason that this time period is chosen is to account for the possibility that the TDR instrument according the present invention is connected to a network near one terminal end of the network while a transmitting station is positioned at the opposite extreme end of the network and the transmitting station begins its transmission just prior to the TDR pulse arriving at the far end of the network. Therefore the propagation delay from one end of the network to the other is accounted for and the window 1 period thus ends at a time equal to twice the end-to-end delay across an entire Ethernet network.

According to the Ethernet specification, a network segment can be no greater than 500 meters. The velocity factor of a typical coaxial cable employed with Ethernet is 0.77, so the round trip delay time of a maximum length Ethernet segment would be as follows:

$$\frac{500 \text{ meters} \times 2}{(0.77 \times 300{,}000{,}000 \text{ meters per sec.})} = 4.33 \text{ microseconds}$$

In the above formula, 500 is the length in meters of the network segment, which is multiplied by 2 to account for the round trip propagation. The speed of light is 300,000,000 meters per second and is multiplied by the velocity factor of the Ethernet coaxial cable (0.77) to complete the determination of round trip propagation time of a pulse. The 4.33 microsecond value sets the minimum time for ending the window 0 period and beginning the window 1 period.

An Ethernet network may comprise more than one segment with repeaters therebetween, so the window 1 period accounts for the possible delays across repeaters and segments for a maximum size network. Once the window 1 period has ended, suitably 51.2 microseconds after the pulse was sent (plus a small margin of time), a length of time equal to an Ethernet slot time (the upper bound on the collision vulnerability of a given transmission), then window 1 is finished and the window timer output again goes low to provide a third window period (window 2). During the window 2 period, any subsequent frame data that appears on the Ethernet is not intentionally collided with, since the data did not appear on the network in a time period as would give rise to a suspicion of collision with the TDR pulse. Prior to subsequent TDR pulse/collision detect periods, window timer 76 is reset by asserting RST signal 77 to ensure a new timing cycle.

If a collision is detected, then a collision is forced on the system, since the TDR pulse generated is of such a short duration that it would likely not be detected as a collision by any of the stations or nodes on the Ethernet. The present invention therefore provides collision enforcing, enabling low protocol level time outs to occur rather than requiring that corrupted data be passed to higher protocol levels for detection of the data errors resulting from the collision, which would result in long time outs noticeable to the user.

If a collision is detected in accordance with the operation discussed hereinabove, then it is advantageous to force a collision. In accordance with the Ethernet specification, if a collision is detected by a transmitting station, then transmission must terminate and a "jam" must be transmitted to ensure that all stations that are participating in the collision also recognize that it has occurred. A "jam" is suitably defined as 4 bytes of arbitrary data. In accordance with the present invention, the transmission of arbitrary jam data is simulated by the application of a DC bias to the network cable via connector 66. This DC bias is suitably applied by the switching on of switch 71 whereby current source 72 is then connected to the Ethernet cable. The current source is such that the DC bias applied to the Ethernet cable is approximately −1 volts which simulates the transmission of data, given the Ethernet signal levels of 0 and −2 volts and the Manchester encoding of the data called for by the Ethernet specification, wherein a transition occurs in the middle of every bit cell. With Manchester encoding, the first half of the bit cell contains the complement of the bit value and the second half of the bit cell contains the true value of the bit. Thus, the Manchester encoded data has a 50 percent duty cycle. The data rate is 10 megabits per second which provides a 100 nanosecond length bit cell.

The DC bias applied to the network cable is asserted for sufficient time to allow the jam to propagate through the system, crossing any repeaters that may be present, thereby allowing all participating stations to recognize that a collision has occurred. Once a sufficient time has passed, the DC bias is removed by opening switch 71 that connects the current source to the secondary of transformer 64S. Thus, the Ethernet back-off algorithm, wherein stations that have participated in a collision delay a random amount of time before retransmitting, will be employed by stations involved in the collision. The Ethernet back-off algorithm for retransmission is fairly efficient and by simulating the collision as noted hereinabove, the TDR apparatus according to the present invention allows quick recovery from any collisions with the TDR pulses. When performing TDR, multiple numbers of pulses are typically generated in order to provide high resolution over multiple measurements, so the quick recovery from collisions is highly advantageous.

Referring still to FIG. 2, once the collision signal 86 is generated, indicating that a collision has been detected by the TDR apparatus, window timer 94 receives the collision signal which results in timer 94 asserting an output signal 96

(FORCE_B) for a period of time determined in accordance with the characteristics of the window timer. The FORCE_B signal controls operation of switch 71 such that when FORCE_B is asserted, switch 71 is closed, thereby connecting current source 72 to cable connector 66 through the secondary side of transformer 64. When FORCE_B is deasserted, switch 71 is open and the current source is disconnected from the cable connector. The amount of time that FORCE_B is asserted is suitably the amount of time dictated by the Ethernet collision protocol (i.e., the 8-byte time preamble transmission period plus the jam transmission period of 4 byte time lengths), which in a 10 megabit per second Ethernet system is 9.6 microseconds.

Figure 3:
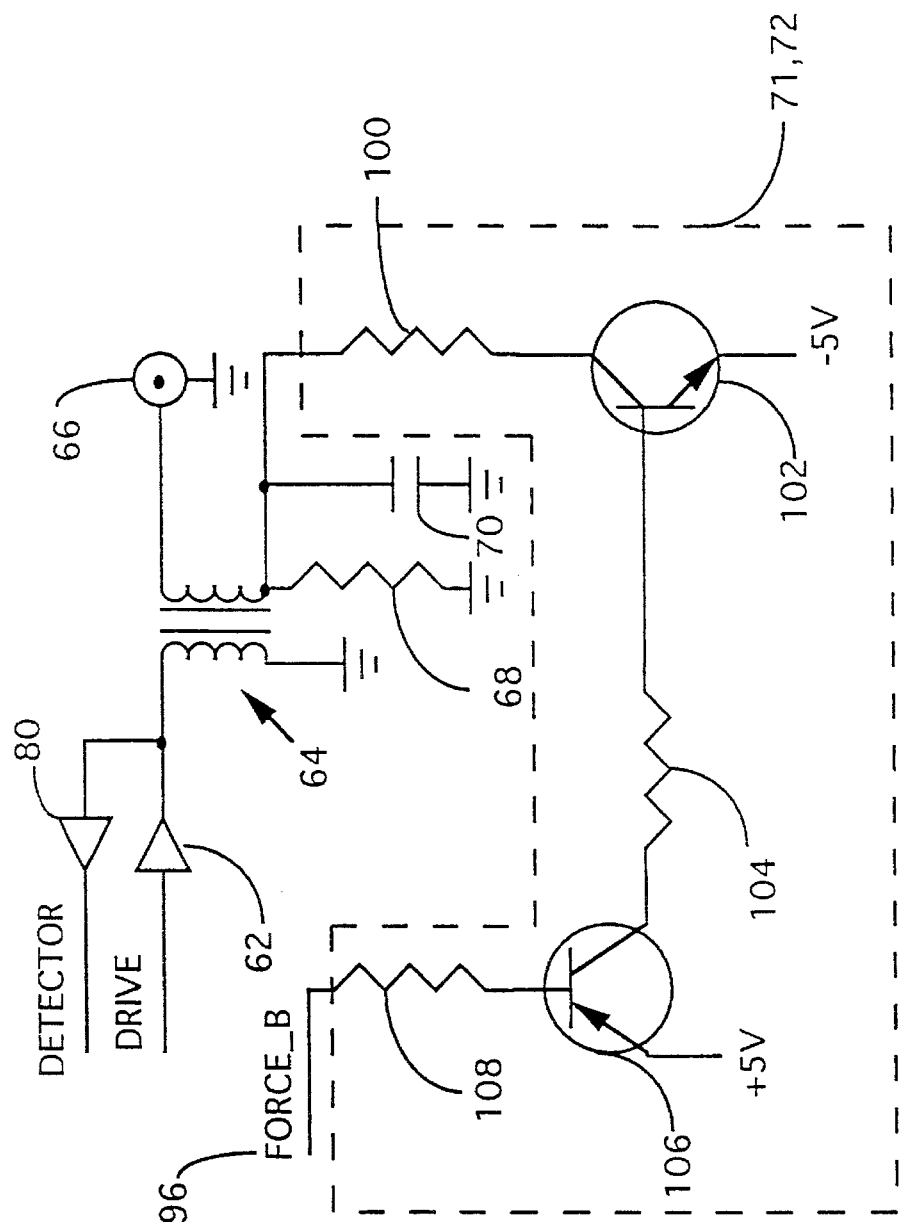
FIG. 3 is schematic diagram of an implementation of a specific crossover network according to the present invention.

Referring now to FIG. 3, a schematic diagram of a particular driven crossover network, this implementation will be described. The driven crossover network comprises, as discussed herein-above, the transformer 64, the primary of which is connected to a driver 62, and a detector 80 for providing TDR pulses and detecting the same. The second leg of the primary of the transformer is connected to ground. The secondary of the transformer is connected to the connector 66 which suitably interfaces with the Ethernet. The second leg of the transformer secondary is connected, as noted hereinbefore, to impedance 68 which is suitably a 50 OHM resistor in a particular application, to provide the proper termination on the Ethernet, so as to not result in reflections or other problems which would appear as a result of an improperly terminated node. Bypass capacitor 70 bypasses high frequency components to ground. The transformer provides an AC path for signals, while the resistor provides the proper DC termination. Capacitor 70 removes the effect of resistor 68 for AC path signals.

Also connected to the second leg of the secondary of transformer 64 is the output of switching and current source circuit 71, 72 which corresponds to the switch 71 and current source 72 of FIG. 2. The switch and current source circuit 71, 72 comprises a resistor 100 which is connected between the secondary of transformer 64 and the collector of NPN transistor 102. The emitter of transistor 102 is connected to a voltage supply, suitably a −5 volts, while the base of transistor 102 is coupled to the collector of PNP transistor 106 by way of resistor 104. The emitter of transistor 106 receives a +5 volt supply, while the base of transistor 106 is supplied the FORCE_B signal 96 (FIG. 2) via resistor 108.

In operation, when the FORCE_B signal is asserted to force the bias to be applied to the network for forcing a collision when a collision has been detected, the transistor 106 is turned on whereby transistor 102 is then turned on, thereby applying bias to the network, as dropped by resistor 100 to approximately −1 volt. This bias simulates a jam signal being transmitted on the network, and the window timer 94 (FIG. 2) assures that the FORCE_B signal remains active for a time to cause both transistors 106 and 102 to conduct for a sufficient period of time to result in a bias being applied for sufficient duration to allow the collision to be detected across the network, even if the signal needs to propagate across any repeaters in the network.

In accordance with the time-domain reflectometry instrument of the present invention, TDR pulses are sent out across the network. The typical pulse length is 125 nanoseconds. Such a pulse will propagate throughout the network but will not likely be recognized as a collision by transmitting stations on the network. However, even though the various transmitting stations will not recognize this collision, the pulse is capable of creating bit errors in the data transmitted by a particular station. Thus, as noted hereinabove, the bit errors will go undetected by the low-level transmission protocol and will require that the next level up or higher protocol determine that a data error has occurred. The difficulty with not detecting the bit error at the lower level protocol is that the higher level protocol may require 3 or 4 seconds or more before timing out or otherwise determining that an error has occurred. In performing the time-domain reflectometry, a large number of pulses are sent out in order to increase resolution and obtain accurate measurements. Thus, the multiple pulses will collide with frames which will result in retransmission of the frames, but the continued pulses of the TDR operation will potentially collide with the resent frames and therefore the network can slow down. Therefore, in accordance with the invention as noted hereinabove, when the various media access units of the stations on the network see that the DC voltage level on the Ethernet cable (in a coaxial environment) has dropped below the voltage that would be expected from one station transmitting to the voltage level as would occur when two or more stations were transmitting, the station transmitting data which has been corrupted by the TDR pulse will recognize a collision has occurred. Ethernet handles collisions very efficiently, so the present invention advantageously makes use of this efficient collision handling by transmitting a TDR pulse, typically 125 nanoseconds in length, and then waiting for an Ethernet slot time while observing whether any frames are received during that slot time. If a frame does occur during that slot time, and assuming a maximum allowable length network (according to the Ethernet protocols and standards) is present, then a bit error may have been caused in the frame by the previously sent pulse. Rather than do nothing and hope a bit error did not occur, according to the present invention, a collision is forced by employing a DC signal applied to the cable that appears to other stations on the network to be a transmitting station as far as collision detection is concerned. That DC bias propagates back to the station transmitting the collided-with frame and that station recognizes that its transmission has been collided with and will back off (voluntarily delay retransmitting in order to reduce the load on the network) and retry the transmission according to the Ethernet back-off protocol. The back-off protocol is such that if a station is involved in a collision, a station will wait a random amount of time before attempting to retransmit. When a station is first involved in a collision, it will either retransmit immediately or wait one Ethernet slot time (which is 51.2 microseconds). After again retrying, if the station is involved in a collision a second time, it will next randomly select a wait time of zero to three slot times. If involved in still a further collision, this station will next randomly wait any one of zero to seven slot times. This process continues with the wait time being randomly selected from a range of zero to $2^n-1$ slot times up to n=10.

In an Ethernet environment, the physical layer is the lowest protocol layer and provides a 10 megabit per second physical channel through a coaxial cable medium. The physical layer performs two functions that are associated with physical channel control, data and coding, which include preamble generation/removal for synchronization and bit encoding and decoding, as well as channel access which includes bit transmission and reception, carrier sense which indicates traffic on the channel and collision detection. Thus, in accordance with the present invention, collision of a TDR pulse with other data transmitted by other stations on the channel is detected at the physical layer level and is suitably responded to in the most rapid and efficient manner available on the Ethernet. The present invention therefore provides the ability to perform TDR measurements on an active network without degrading network throughput.

Once a collision is detected by the physical layer, a data link layer is notified and collision handling begins wherein a collision is enforced by the transmission of a bit sequence called a jam, thereby ensuring that the duration of the collision is sufficient to be noticed by the other transmitting station or stations. In the present application, since the TDR pulse is of insufficient duration to be noticed by other stations on the Ethernet, the collision is enforced by the application of the bias via the driven crossover network discussed hereinabove with reference to FIGS. 2 and 3. The Ethernet specification requires that if a collision occurs during the transmission of a preamble (a 64-bit synchronization transmission that precedes all frame/packets that are sent by a station), then the preamble must be completed and then be followed by a 4-byte jam pattern. If the preamble has already been completed, then a 4-byte jam pattern is sufficient. This requirement ensures that a frame is transmitted for sufficient time to propagate the collision throughout the network, which may include a number of repeaters. Since the preamble is 64 bits (8 bytes) and the 4-byte jam pattern (32 bits) is required, a corresponding 12-byte time length bias is the minimum that should be applied by the apparatus. Therefore, the FORCE_B signal referred to hereinabove with reference to FIG. 3 and FIG. 2 is maintained for 12-byte times which is equal to 9.6 microseconds. This value is obtained as follows: since the Ethernet is a 10 megabit per second system, one bit time is 100 nanoseconds. One byte is 8 bits, which equals 800 nanoseconds times 12 bytes equals 9600 nanoseconds which equals 9.6 microseconds.

As noted hereinabove with reference to FIG. 2, a comparator 82 detects whether any frame transmissions occur during the period following the transmission/return reception of the TDR pulse and the remainder of time in an Ethernet slot time (an Ethernet slot time is suitably 51.2 microseconds, which is the maximum network end-to-end round trip delay for a bit transmitted on a segment of the network). If such energy is detected by comparator 82, then as noted above the BNCNRG signal 84 is asserted and if the energy is detected during the appropriate window time, the window timer 76 output is also asserted resulting in a collision indication.

Figure 4:
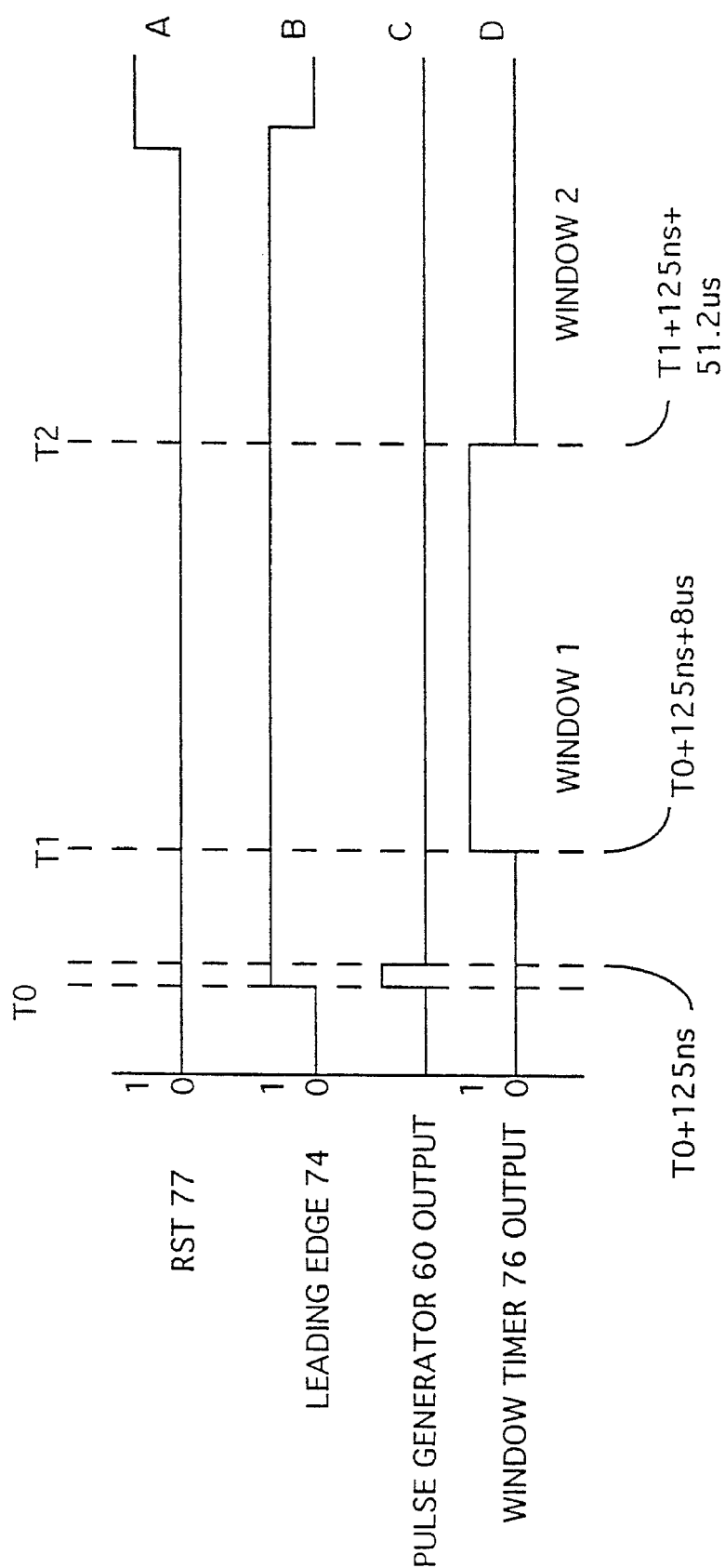
FIG. 4 is a timing chart illustrating the time relationship between the time-domain reflectometry pulse generation and the detection of potential collisions.

Referring now to FIG. 4, a timing chart illustrating the relation of the generation of a TDR pulse and the detection of a collision, the timing of the window timer 76 in conjunction with the output of a TDR pulse and the operation of the comparator 82 (of FIG. 2) may be better understood. In FIG. 4, the TDR pulse is represented by the "pulse generator 60 output" line. At time T0, the TDR pulse is generated and output through the cable connector 66 (FIG. 2). Simultaneously with the generation of the pulse, the signal leading edge 74 goes from low to high which, supplied to window timer 76, instructs the timer to begin its timing sequence. The output of window timer 76 remains low until time T1 occurs 8.125 microseconds after T0, which is a sufficient amount of time for the TDR pulse to propagate round trip on a maximum length Ethernet segment (4.33 microseconds plus a margin of time to enable, for example, testing for over length segments). At time T1, the output of window timer 76 goes high whereupon the window period begins for detecting frames on the Ethernet which may have potentially been collided with by the TDR pulse. This period lasts until time T2, which is suitably 51.325 microseconds after T1, since as noted hereinbefore, the collision, if any, will occur within an Ethernet slot time (51.2 microseconds). Once the 51.325 microsecond time period has elapsed, then at time T2, the output of window timer 76 goes low which prevents any traffic on the network from being mistakenly interpreted as a collision, since the time period during which a collision might have occurred has now passed. The window 2 time period continues until a reset occurs. Upon assertion of reset signal RST 77, the window timer is reset, whereupon subsequent TDR pulses and measurements can occur.

Figure 5:
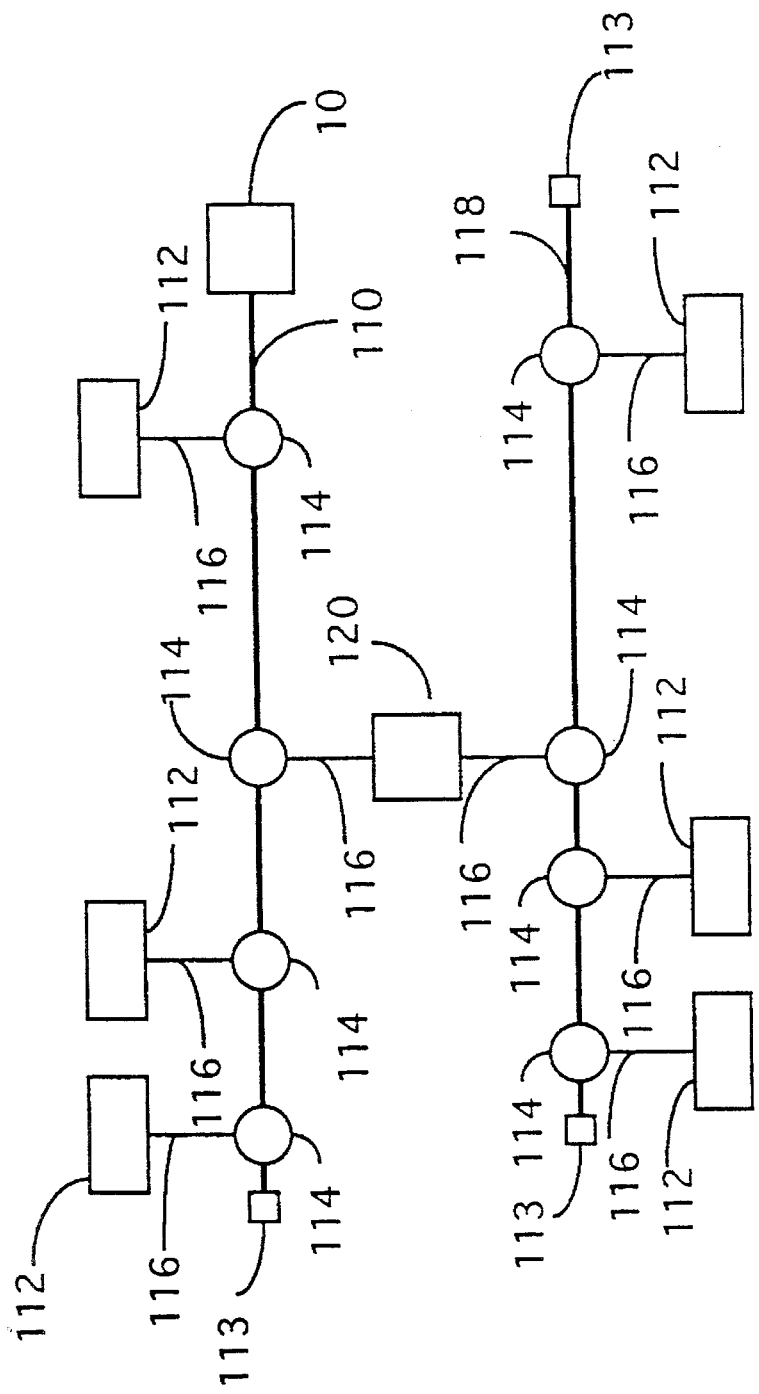
FIG. 5 is a diagrammatic representation of an Ethernet having two coaxial cable segments and a repeater therebetween.

FIG. 5 is a diagrammatic representation of an Ethernet having two coaxial cable segments with a repeater therebetween. A first cable segment 110 includes several representative stations 112 thereon, also known as nodes, wherein each station or node is attached to the coaxial cable segment 110 by a cable tap 114. Each end of an Ethernet segment is terminated by a 50 OHM terminator 113, which provides a termination impedance equal to the characteristic impedance of the network cable, thereby eliminating reflection from the ends of the cable. However, when performing TDR in accordance with the instrument described herein, the TDR apparatus 10 replaces one of the 50 OHM terminators at one end of the segment being tested. The location of the instrument 10 in FIG. 5 is for illustrating placement when performing a typical TDR operation; if not performing TDR, the TDR apparatus can be suitably attached to the network at any node and function as a station on the network. Between each of the respective stations and taps are cables 116 which connect the node or station to its respective cable tap. A second cable segment 118 is also illustrated wherein the segment is terminated at each end by 50 OHM terminators 113 and wherein three representative stations 112 are present on the second segment, connected via cables 116 and cable taps 114 to the segment 118. Disposed between the two cable segments 110 and 118 is a repeater 120, wherein the repeater interconnects the two segments, a cable tap and connector cable 114 and 116 connecting the repeater to second segment 118 and a separate cable 116 and tap 114 connecting the repeater to the first segment 110. A transmission of data that occurs on either segment of 110 or 118 will be repeated and retransmitted on the other segment by the repeater.

The operation of the TDR is such that various reflections of different magnitudes and polarities may be detected, to allow isolation of multiple faults in a system. The level and polarity of the reflection that is to be detected is set by TDR_V signal 92 (FIG. 2) which is generated by the digital analog converter 90 under direction of CPU 12 (FIG. 1). Thus, comparator 88 will detect a return pulse when the pulse exceeds the magnitude of TDR_V. Once such a pulse is detected, the comparator supplies a signal to counter/interpolator circuit 89 indicating that the return pulse has been detected. The counter and interpolator thereby provides an accurate determination of the amount of time elapsed between the leading edge of the pulse, as conveyed to the counter/interpolator by leading edge signal 74, and the receipt of the return pulse by comparator 88. The interpolator is employed to provide higher accuracy and more precise timing of the return pulse. In the preferred embodiment, this interpolation is accomplished according to a dual slope interpolation circuit, which is well known in the art. The counter/interpolator circuit also includes a counting and masking function which allows various faults to be masked off whereby faults of lesser magnitudes can be detected by ignoring known faults of greater magnitudes. For example, if a large magnitude fault is detected at a time T, comparator 88 will indicate the presence of that fault each time at T, since when TDR_V is set to a lower level for detection of smaller magnitude faults, the large magnitude fault will always be greater than the TDR_V level. Therefore counter/interpolator circuit 89 in conjunction with commands from CPU 12 will effectively ignore the detection of the large fault by the comparator, instead responding and timing the lesser fault. By successively lowering the level of TDR_V, a series of faults of various magnitudes can be detected, whereupon subsequent determination of a fault may be employed to provide further masking whereby more than one fault may be ignored by the operation of the masking function.

Figure 6:
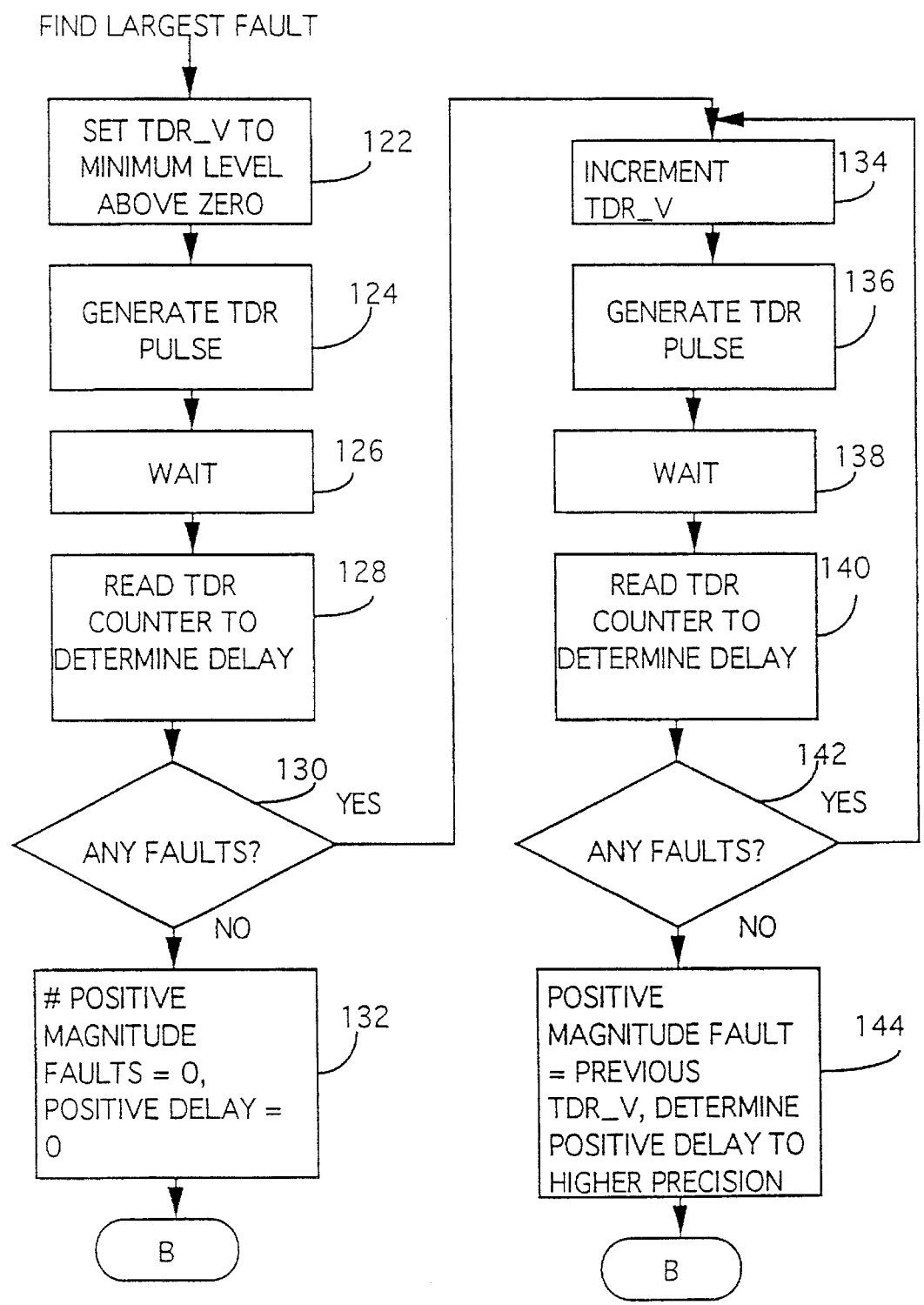
FIGS. 6 and 7 together comprise a flow chart of a time-domain reflectometry operation according to the present invention.
Figure 7:
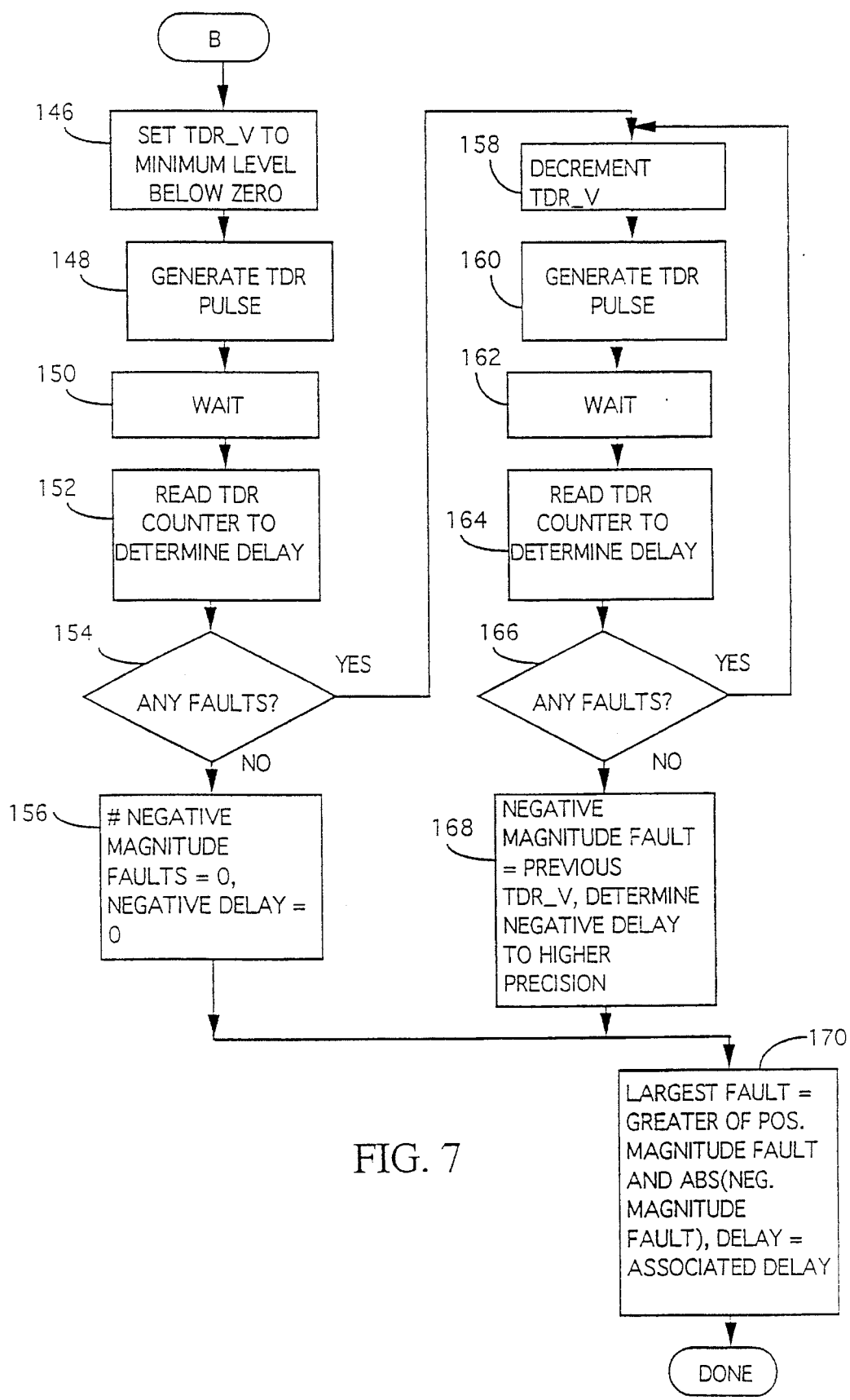

Referring now to FIGS. 6 and 7, which taken together comprise a flow chart of an exemplary TDR operation according to the present invention, this typical TDR operation will be described. In the illustrated embodiment, the particular operation shown is the finding of the largest fault on the network.

The first series of steps in the operation comprise determining the largest positive magnitude fault on the network. Accordingly, in step 122, the value of TDR_V (FIG. 2) is set to a minimum level above 0 volts. This is accomplished by the CPU instructing digital analog converter 90 (FIG. 2) to generate the appropriate output voltage to be supplied to the comparator 88 for detecting a fault. Next, a TDR pulse is generated (block 124) wherein pulse generator 60 of FIG. 2 is instructed by the CPU to generate a pulse of the specified magnitude which in the preferred embodiment is a fixed value. The pulse as generated is passed through driver 62 via transformer 64 to the Ethernet as connected to cable connector 66. Once the pulse has been generated, the pulse generator also begins operation of counter/interpolator 89, via generation of leading edge signal 74 (also in FIG. 2). The counter portion of block 89 will then begin timing until a reflected pulse is detected. Thus, in step 126, a wait period is observed to allow the pulse to propagate across the network and return. This wait period is suitably a sufficient period of time for the pulse to return and the delay thereof to be calculated. In step 128, the TDR counter is read from the counter/interpolator block 89 of FIG. 2. The counter value is representative of the delay from transmission of the pulse until reception of the pulse and the actual delay is easily determined in time units by multiplication of the counter value by the unit of time per count.

A determination is now made whether any faults exist, to account for the possibility that there are no faults in the system. If there are no faults, then the counter will have returned a maximal value indicating that no reflected pulse was ever received. In such a case, then step 132 is performed wherein an indication is saved that no positive magnitude faults are present and the positive fault delay is set to zero. The operation then continues at off-page connector B of FIG. 7.

If in decision block 130, faults were detected, then steps are taken to find any larger faults that may exist, since the first fault that was located is known to be at least as great as or greater than the value to which TDR_V was initially set (a minimal incremental level above 0 volts). Accordingly, in step 134, the TDR_V is incremented to raise the input to comparator 88 (FIG. 2) to allow a successively larger fault to be detected (if present). Next, a TDR pulse is generated in step 136 and a wait period is observed in block 138 to allow sufficient time for the pulse to return and the delay thereof to be calculated. In step 140, the delay count is read and a determination is again made (decision block 142) as to whether any faults greater than or equal to the present magnitude of TDR_V exist. If such faults do exist, then the process loops back to continue with block 134 wherein TDR_V is again incremented. This incrementing, pulse, wait, read delay and check for fault series of steps continues until such time as a determination is made in decision block 142 that no faults greater than or equal to the present magnitude of TDR_V (which has been successively incremented through the looping of the process) exist. At such time as no such faults are detected, the process enters block 144 wherein the maximum positive magnitude fault value is saved (suitably equal to the magnitude of TDR_V on the previous loop). In block 144, the delay to the fault is more precisely determined. To make this precise determination, the delay that was associated with the largest found fault is used as a masking value for the counter/interpolator circuit and additional TDR pulses are sent with the value of TDR_V set to one half the value of the largest fault that was just determined, i.e. one half the value of TDR_V on the previous iteration. Therefore, a TDR pulse is sent out with TDR_V set at one half the fault magnitude from the previous iteration, and the interpolator ignores any return reflections except the one that occurs at around the delay time of the fault from the previous iteration. A reason that such a method is employed is that a more accurate determination of the delay time to the fault is thereby available, since the fault time is determined to occur at the half way point on the rising edge of the reflected pulse, thereby providing immunity to noise occurring at the start of the rising edge and at the end of the rising edge of the reflected pulse. Once these magnitude and delay values have been stored, processing continues at off-page connector B of FIG. 7.

Referring now to FIG. 7, off-page connector B begins the next series of steps which will determine the largest negative magnitude fault on the network. Therefore, in step 146, the value of TDR_V (FIG. 2) is set to a minimum level below zero (block 146). As in step 122 before, this setting is accomplished by commanding digital-to-analog converter 90 (FIG. 2) to generate an appropriate output voltage, whereupon the output voltage is supplied to comparator 88 for detecting a fault. Then, in step 148, a TDR pulse is generated such that pulse generator 60 of FIG. 2 receives instructions from the CPU to generate a pulse, suitably of a fixed magnitude in the preferred embodiment. The pulse passes through driver 62 via transformer 64 to the Ethernet via cable connector 66 and at the same time, the pulse generator starts operation of the counter/interpolator via the leading edge signal 74. The counter in block 89 then determines the period of time until the reflected pulse is detected. Therefore, in block 150 a wait period is observed to allow sufficient time for the negative pulse to propagate through the network and be reflected back and the delay thereof to be calculated. Once sufficient time has passed to allow the return pulse to be detected, the TDR counter is read to determine the delay time to the fault (step 152). Decision block 154 then determines whether any faults exist. If no faults exist, then the number of negative magnitude faults is set to zero and the time delay to the negative fault is set to zero, since no faults were detected with the TDR_V comparator input set to a minimum level below zero. Setting these two valves to zero indicates that no negative magnitude faults exist with a magnitude below the minimum level to which TDR_V had been set. Processing then continues at step 170 which is described hereinbelow.

However, in decision block 154, if faults have been detected, then the value of TDR_V is decremented in block 158 to lower the threshold to attempt to determine the negative magnitude of the negative faults that are present. A TDR pulse is again generated in block 160 and the round trip delay wait period is observed in step 162. Again, in block 164, the TDR counter is read to determine the delay between the transmission and reception of the reflected pulse. In decision block 166 a determination is made whether any fault exists at this given TDR_V magnitude. If no such fault exists, then the largest negative magnitude fault was equal to the magnitude of the value of TDR_V on the previous iteration through the loop 156–166 previous to the current loop. Therefore, in block 168, the negative fault magnitude is set equal to the previous value of TDR_V and the delay to this negative magnitude fault is then determined to a higher precision in block 164. Much like in the case of more precisely determining the delay to the positive magnitude fault, the delay to the negative fault is more precisely determined by using the delay that was associated with the largest found negative magnitude fault as a masking value for the counter/interpolator circuit. Then, additional TDR pulses are sent with the value of TDR_V set to one half the value of the largest negative fault just determined, i.e. one half the value of TDR_V on the previous iteration. Therefore, a TDR pulse is sent out with TDR_V set at one half the fault magnitude from the previous iteration, and the interpolator ignores any return reflections except the one occurring at around the delay time of the fault from the previous iteration. Again, employing such a method enables more accurate determination of the delay time to the fault, since the fault timing takes place at the half way point on the falling edge of the reflected pulse, thereby providing immunity to noise occurring at the start of the falling edge and at the end of the falling edge of the reflected pulse. Processing then continues at block 170 as discussed hereinbelow.

However, if faults still exist in block 166, then a loop back to step 158 is performed wherein TDR_V is again decremented to further lower the test threshold. The looping through blocks 158–166 continues until such time as no further faults are detected, whereupon the negative magnitude fault will have been determined in accordance with the values set in the previous iteration.

Referring still to FIG. 7, block 170 determines the largest fault by finding the greater of the positive magnitude fault and the absolute value of the negative magnitude fault. The delay to the largest fault is then also set to be the associated delay with the largest magnitude fault value. The process of finding the largest fault is then completed.

Once the largest fault has been found, successive smaller faults can be located by masking off the largest fault previously located and searching for other faults. This masking is accomplished by the counter and interpolator 89 (FIG. 2) wherein the delay time to the largest fault is supplied to the interpolator in conjunction with a mask signal such that the interpolator will ignore the detection by comparator 88 of reflected energy from the largest fault and will determine the delay time to other faults which may be present.

By successively performing these steps, masking off various located faults, all of the faults which may be present in a particular cable may be located and determined.

Figure 8:
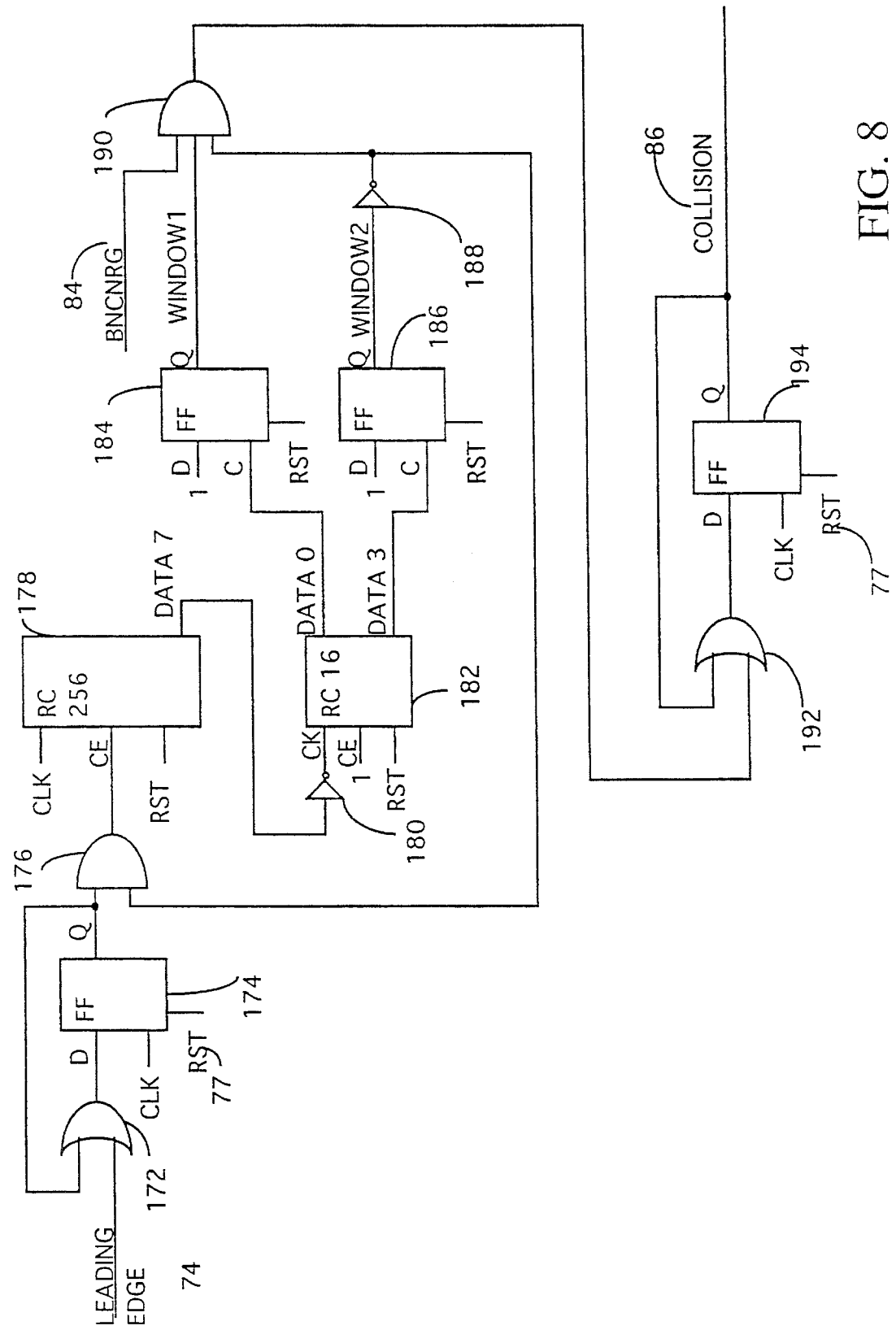
FIG. 8 is a block diagram of a particular implementation of window timing circuit 76 of FIG. 2.

Referring now to FIG. 8, a block diagram of a particular implementation of the window timing circuit 76, the operation thereof for the detection of collisions and generation of the collision detection signal 86 (FIG. 2) will be further described. The collision timing circuit receives leading edge signal 74 (generated by pulse generator 60 of FIG. 2) to one input of OR gate 172. The output of OR gate 172 is supplied as a data input to a flip-flop 174 while the output of the flip-flop is supplied as a second input to OR gate 172. The flip-flop also receives a clocking signal and a reset signal 77. The output of the flip-flop is further provided as an input to a first leg of AND gate 176 wherein the output of AND gate 176 is received on the count enable line of ripple counter 178. The ripple counter also suitably receives a clock input and reset input 77. In the particular embodiment, ripple counter 178 is an 8-bit ripple counter (thereby counting from 0 to 255) and the high data bit output line thereof is supplied to an inverter 180 whereupon the inverter output is received by ripple counter 182 as a clock input thereto. The count enable line of ripple counter 182 is set to TRUE while reset signal 77 is also supplied to the ripple counter 182. Ripple counter 182 is suitably a 4-bit counter (thereby counting from 0 to 15) and the bit zero output line thereof is supplied as a clocking input to flip-flop 184 while the bit three output line of counter 182 is supplied as a clock input to flip-flop 186. Both flip-flops 184 and 186 receive the reset signal 77 and the data input to both flip-flops is set to TRUE. The output of flip-flop 184 comprises a window 1 signal and is supplied as an input to one leg of three input AND gate 190 while the output of flip-flop 186 is inverted by inverter 188 whereupon the inverted output thereof is provided to a second input leg of AND gate 190. The inverted output of flip-flop 186 is also supplied as the second input to AND gate 176. The third input to three input AND gate 190 comprises the BNCNRG signal 84 as generated by comparator 82 (FIG. 2). The output of three input AND gate 190 is supplied as input to OR gate 192 whereupon flip-flop 194 receives the output of OR gate 192 as its data input. Clock and reset signals are provided also to flip-flop 194 while the output of flip-flop 194 is fed back to comprise the second input to OR gate 192. The output of flip-flop 194 is further provided as the collision signal 86.

The operation of the circuitry of FIG. 8 will now be described. Prior to operation, the reset signal 77 (RST) is asserted whereby the various counters and flip-flops are reset such that their output lines are respectively logic zeros. Upon generation of a TDR pulse, the leading edge signal 74 is set to be logical one whereupon the output of OR gate 172 becomes high. The flip-flop 174 then has its output go high (in time with the clock signal CLK). Since the output of the flip-flop is fed back to OR gate 172, the data input to flip-flop 174 remains high until a reset occurs, since one leg of the OR gate will remain high even after the leading edge signal 74 is removed. Once the output of flip-flop 174 goes high, both legs of AND gate 176 are then high, since the flip-flop output comprises a first input to the AND gate and the inverted output (via inverter 188) of flip-flop 186 is the second input to the AND gate, and the flip-flop 186 has previously been reset to have a zero output, resulting in a logical one as the second input to AND gate 176. When the output of AND gate 176 goes high, then the count enable line of ripple counter 178 goes high, whereupon the ripple counter begins its count cycle in accordance with the clock signal CLK. The high bit data line of the ripple counter is acquired as output so the ripple counter will provide a delay by counting from 00000000 binary to 01111111 binary before the bit 7 data line goes high. Once the bit 7 data line (DATA 7) goes high, the clock input to ripple counter 182 will go low (since inverter 180 is interposed between the two ripple counters). Ripple counter 178 continues to count and when the count rolls over from 11111111 to 00000000, the bit 7 data line will go low, which will result in the bit zero output of counter 182 going high and accordingly the clock input to flip-flop 184 changing state whereupon the output of flip-flop 184 will go high (since the data input is tied to a logical one). This signal as conveyed to three input AND gate 190 comprises the window 1 enable signal which results in the beginning of the window timing to look for collision data (BNCNRG) on the Ethernet. Since flip-flop 186 is initially set to zero, the output of inverter 188 is one, so two of the three inputs to AND gate 190 are both logical ones. Therefore, assertion of the BNCNRG signal 84 (which occurs if comparator 82 (FIG. 2) detects any transmissions on the Ethernet) will result in the output of AND gate 190 being set to logical one.

The function of ripple counter 178 is to divide the clock input to ripple counter 182 such that a sufficient delay occurs before the window 1 signal is asserted and subsequently deasserted. As ripple counter 178 continues to cycle through its counting, every 128 counts the high bit output of the ripple counter will change state, changing the state of the clock to ripple counter 182. Thus, ripple counter 182 will count at a much slower rate than counter 178 since counter 182 has a much slower clock rate.

Once the ripple counter 182 has counted such that its high output bit (DATA 3) becomes logical one, the output of flip-flop 186 will go high and as inverted by inverter 188, the third input to AND gate 190 will go low, thereby closing the window for observing the possibility of collision of the TDR pulse with other data on the network. Simultaneously with the output of flip-flop 186 going high and subsequently the output of inverter 188 going low, AND gate 176 has its output go low since one of the inputs thereto is now low, and the count enable line of ripple counter 178 is thereby deasserted, resulting in counting stopping. The flip-flop 186 through its inverter 188 in conjunction with AND gate 176 thereby halts any subsequent state change of the output of flip-flop 184 or flip-flop 186 such that no further energy appearing on the network (via BNCNRG signal 84) will be observed as colliding with the TDR pulse.

Referring again to the state where both the output of flip-flop 184 and the inverted output of flip-flop 186 are providing logical one inputs to AND gate 190, if any data is detected on the network via BNCNRG, the output of AND gate 190 will go high. Subsequently, the output of OR gate 192 will also go high and the flip-flop 194 will have its output become TRUE, the output remaining TRUE since it is fed back as one input to OR gate 192 to ensure that the data input to the flip-flop 194 remains high until such time as a reset occurs. This output of flip-flop 194 is provided as the collision signal 86 indicating that a collision between the TDR pulse and a frame of data on the network has likely occurred. This collision signal 186 is then supplied to a second window timer 94 (FIG. 2) which controls the timing of the FORCE_B signal assertion used to apply the collision enforcement bias signal to the network via transistors 106 and 102 (as discussed hereinabove in conjunction with FIG. 3). The window timer 94 may also suitably comprise ripple counters with appropriate timing to generate the required length of assertion of the FORCE_B signal. As noted hereinabove, this required length is suitably 12-byte times in an Ethernet system which in a 10 megabit per second system would comprise 9.6 microseconds.

It will be understood that the instrument in accordance with the present invention may operate as a node and send and receive traffic as appropriate. However, such a state is incompatible with the TDR mode, since when in the TDR mode, the Ethernet cable needs to be terminated with the proper impedance (i.e., at 50 OHMS) so as not to generate multiple reflections as would give inaccurate TDR readings. On the other hand, when receiving and sending traffic, the apparatus needs to function as a node which is a high impedance path. In such a situation, the apparatus provides the appropriate high impedance.

Accordingly, the present invention provides an instrument that performs time-domain reflectometry on an operating network without causing bit errors as would go undetected by the media access control level protocol. Any data frame that is transmitted by a station on the network as may have a bit error caused by the time-domain reflectometry pulse from the instrument is intentionally collided with and results in retransmission of the data frame by the transmitting station at a much lower level in the protocol stack. Therefore, since Ethernet is designed to efficiently use collisions for regulating access to the network, retransmission occurs quickly, typically in microseconds.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method of performing time domain reflectometry on a network, wherein the network comprises multiple stations interconnected by a data link, the method comprising the steps of:

generating a pulse on the data link;

detecting potential collision between the pulse and other transmission data on the data link; and forcing a collision if the result of said detecting step is that a collision has potentially occurred.

2. A method of performing time domain reflectometry on a network, wherein the network comprises multiple stations interconnected by a data link, the method comprising the steps of:

generating a pulse on the data link, wherein said generating step comprises sending said pulse through a crossover network;

detecting potential collision between the pulse and other transmission data on the data link; and forcing a collision if the result of said detecting step is that a collision has potentially occurred.

3. A method of performing time domain reflectometry on a network, wherein the network comprises multiple stations interconnected by a data link, the method comprising the steps of:

generating a pulse on the data link;

detecting potential collision between the pulse and other transmission data on the data link; and forcing a collision if the result of said detecting step is that a collision has potentially occurred, wherein said forcing step comprises applying a bias to the data link for a sufficient length of time to allow all stations on the data link to detect a collision.

4. The method according to claim 3 wherein said bias comprises a DC bias.

5. The method according to claim 3 wherein said bias is applied through a crossover network.

6. A method of performing time domain reflectometry on a network, wherein the network comprises multiple stations interconnected by a data link, the method comprising the steps of:

generating a pulse on the data link;

detecting potential collision between the pulse and other transmission data on the data link; and forcing a collision if the result of said detecting step is that a collision has potentially occurred, wherein the network comprises an Ethernet network.

7. A time domain reflectometer for performing time domain reflectometry on an active network, wherein the network comprises multiple stations interconnected by a data link, comprising:

a pulse generator for generating a time-domain reflectometry pulse;

receiving means for receiving reflected time-domain reflectometry pulses;

means for coupling said pulse generator and the generated pulse to the data link, and for coupling said receiving means to the data link;

collision detection means for determining whether a pulse has potentially collided with transmissions from stations on the data link; and collision forcing means for forcing a collision on the data link if said collision detection means determines that a pulse has potentially collided with transmissions from stations on the data link.

8. A time domain reflectometer for performing time domain reflectometry on an active network, wherein the network comprises multiple stations interconnected by a data link, comprising:

a pulse generator for generating a time-domain reflectometry pulse;

receiving means for receiving reflected time-domain reflectometry pulses;

means for coupling said pulse generator and the generated pulse to the data link, and for coupling said receiving means to the data link, wherein said coupling means comprises a crossover network;

collision detection means for determining whether a pulse has potentially collided with transmissions from stations on the data link; and collision forcing means for forcing a collision on the data link.

9. A time domain reflectometer for performing time domain reflectometry on an active network, wherein the network comprises multiple stations interconnected by a data link, comprising:

a pulse generator for generating a time-domain reflectometry pulse;

receiving means for receiving reflected time-domain reflectometry pulses;

means for coupling said pulse generator and the generated pulse to the data link, and for coupling said receiving means to the data link, wherein said coupling means terminates the network with a desired impedance;

collision detection means for determining whether a pulse has potentially collided with transmissions from stations on the data link; and collision forcing means for forcing a collision on the data link.

10. A time domain reflectometer for performing time domain reflectometry on an active network, wherein the network comprises multiple stations interconnected by a data link, comprising:

a pulse generator for generating a time-domain reflectometry pulse;

receiving means for receiving reflected time-domain reflectometry pulses;

means for coupling said pulse generator and the generated pulse to the data link, and for coupling said receiving means to the data link;

collision detection means for determining whether a pulse has potentially collided with transmissions from stations on the data link; and collision forcing means for forcing a collision on the data link, wherein said collision forcing means is coupled to said coupling means and forces a collision by applying a bias to the data link through said coupling means.

11. A time domain reflectometer according to claim 10 wherein said coupling means comprises a crossover network.

12. A time domain reflectometer for performing time domain reflectometry on an active network, wherein the network comprises multiple stations interconnected by a data link, comprising:

a pulse generator for generating a time-domain reflectometry pulse;

receiving means for receiving reflected time-domain reflectometry pulses;

means for coupling said pulse generator and the generated pulse to the data link, and for coupling said receiving means to the data link;

collision detection means for determining whether a pulse has potentially collided with transmissions from stations on the data link; and collision forcing means for forcing a collision on the data link, wherein said network comprises an Ethernet network.

13. A time domain reflectometer for performing time domain reflectometry on an active network comprising:

a crossover network for conveying time-domain reflectometry pulses to the network and for receiving reflected time-domain reflectometry pulses from the network; and a collision enforcement circuit connected to said crossover network, said collision enforcement circuit driving said crossover network to force a collision if a time-domain reflectometry pulse has corrupted network traffic.

14. A time domain reflectometer according to claim 13 wherein said active network comprises an Ethernet.

15. A time domain reflectometer according to claim 13 wherein said crossover network connects to the network and comprises a system providing a desired AC impedance termination and a desired DC impedance termination.

16. A time domain reflectometer according to claim 13 wherein said collision enforcement circuit comprises a DC bias generator, wherein said collision enforcement circuit applies a DC bias to the crossover network to simulate a collision enforcement transmission on the network.

17. A time domain reflectometer according to claim 16 wherein said DC bias generator applies a DC bias of approximately −1 volt to the network.

18. A time domain reflectometer according to claim 16 further comprising a timing circuit for governing the duration of the DC bias applied to the network.

19. A time domain reflectometer according to claim 16 further comprising a collision detector for detecting collisions between time-domain reflectometry pulses and network traffic, wherein said DC bias generator is responsive to said collision detector for applying the DC bias when collisions are detected.

* * * * *